(12) United States Patent
Gulde

(10) Patent No.: US 7,376,309 B2
(45) Date of Patent: May 20, 2008

(54) OPTICAL STRUCTURE

(75) Inventor: Stephan T. Gulde, Pfullingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/679,825

(22) Filed: Feb. 27, 2007

(65) Prior Publication Data

US 2007/0201796 A1 Aug. 30, 2007

(30) Foreign Application Priority Data

Feb. 28, 2006 (EP) .................. 06110489

(51) Int. Cl.
*G02B 6/26* (2006.01)
*G02B 6/34* (2006.01)
*H01S 3/08* (2006.01)
*H01S 3/082* (2006.01)
*H01S 3/083* (2006.01)

(52) U.S. Cl. .................. 385/39; 385/37; 372/94; 372/96; 372/97; 372/98; 372/102

(58) Field of Classification Search .............. 385/39
See application file for complete search history.

(56) References Cited

U.S. PATENT DOCUMENTS 4,743,083 A * 5/1988 Schimpe .............. 385/37

* cited by examiner

*Primary Examiner*—Hemang Sanghavi
*Assistant Examiner*—Kajli Prince
(74) *Attorney, Agent, or Firm*—Ido Tuchman; Lisa M. Yamonaco

(57) ABSTRACT

An optical structure comprising an optical resonator is provided. The optical resonator comprises a first set of nested closed optical regions, forming a distributed feedback resonator structure with a direction of radially alternating optical refractive index, and a second set of nested optical regions, forming a distributed feedback resonator structure with a direction of radially alternating optical refractive index. Each optical region of the second set is interrupted by a first gap region with a lower refractive index, wherein the first gap regions substantially overlap in the direction of radially alternating optical refractive index. The first set is arranged nested within the second set and the optical structure further comprises a first optical waveguide optically coupled to the optical resonator via a first waveguide portion reaching into the first gap regions and being arranged coplanar to the optical resonator.

13 Claims, 2 Drawing Sheets

OPTICAL STRUCTURE

CROSS-REFERENCE TO RELATED APPLICATIONS

This application claims priority under 35 U.S.C. § 119 to European Patent Application No. 06110489.9 filed Feb. 28, 2006, the entire text of which is specifically incorporated by reference herein.

BACKGROUND OF THE INVENTION

The invention relates to an optical structure, more particularly to an optical structure comprising an optical resonator that can for instance be a circular Bragg resonator, with an improved coupling to a waveguide.

Various photonic functionalities can be implemented on the basis of an optical resonator. Prominent examples thereof are spectral filters, light sources such as lasers, electro-optic modulators (EOMs), and all-optical switches.

For many applications, e.g. chip to chip or on-chip optical interconnects, a higher physical integration density of such optical resonator-based functionalities is desirable. Integrated micro-resonators can be very useful. Such integrated optical structures typically make use of waveguides coupled to the micro-resonators. Therein the coupling efficiency is a critical parameter.

In M. A. Kaliteevski et al., J. of Modern Optics 46, 875 (1999) "Bragg reflectors for cylindrical waves" the electromagnetic field in a dielectric structure with circular cylindrical symmetry is described.

In Ochoa et al., Phys. Rev. B 61, 4806 (2000) "Diffraction of cylindrical Bragg reflectors surrounding an in-plane semiconductor microcavity" a model is described for finding the resonant modes of a microcavity bound by a circular Bragg reflector.

In U.S. Pat. No. 4,743,083 devices for controlling and guiding waves, such as electromagnetic waves, acoustic waves, and the like are disclosed which include at least one wave-transmitting medium and a diffraction grating, associated with the transmitting medium, for coupling wave energy into or out of the waves propagating in the grating. The device may take the form of a "sandwich"-type or thin film waveguide, in which case the grating medium has at least one curvi-planar boundary, or it may take the form of a "rod"-shaped or cylindrical waveguide, in which case the grating medium has a substantially cylindrical boundary. A wave propagating in the grating medium is coupled to an unguided free-space type wave mode which is perpendicular to the grating medium. This is achieved by at least part of the grating being of second order in terms of its periodicity. For example, in the case of a planar medium and a circular grating in that medium this corresponds to coupling from the plane of the grating to an unguided wave propagating in a direction perpendicular to that plane.

US 2005/0135453 is directed to a grating-outcoupled microcavity disk resonator that has whispering gallery modes existing in a nearly circular resonator. Light is outcoupled by providing a grating region in the plane of the grating-outcoupled microcavity disk resonator. The grating region provides an outcoupling mechanism that symmetrically interacts with the clockwise and counterclockwise whispering gallery modes, thereby making the resonator capable of surface emission.

J. Scheuer et al., IEEE J. Sel. Top. Quant. Electron. 11, 476 (2005) "InGaASP Annular Bragg Lasers: Theory, Applications, and Modal Properties" discusses a class of circular resonators, based on a radial defect surrounded by Bragg reflectors.

In M. Toda, IEEE J. of Quantum Electronics 26, 473 (1990) "Single-Mode Behavior of a Circular Grating for Potential Disk-Shaped DFB Lasers" a coaxial circular grating resonator for a DFB laser application is described wherein the periodicity and the position of the grating are so chosen that all of the reflections from each refractive index step are superimposed in phase so as to be consistent with the resonant behavior of the fundamental mode wave.

In X. H. Zheng et al., IEEE J. of Lightwave Technology 8, 1509 (1990) "Mode Coupling in Circular-Cylindrical Systems and Its Application to Fingerprint Resonators" a circular resonator with implanted taper-like structures is described. The taper structures are used for realizing energy input and output, similar to a small probe in a classic microwave resonator.

C. Wu et al., Electronics Letters 27, 1819 (1991) "Optically pumped surface-emitting DFB GaINAsP/InP Lasers with circular grating" examines the lasing action in DFB lasers with circular gratings.

In "High-finesse disk microcavity based on a circular Bragg reflector", D. Labilloy et al., Appl. Phys. Lett. 73, 1314 (1998) it is described how disk-shaped microcavities are bounded by reflectors made of circular concentric deep-etched trenches.

BRIEF SUMMARY OF THE INVENTION

According to a first aspect of the invention an optical structure comprising an optical resonator is provided. The optical resonator comprises a first set of nested closed optical regions, which form a distributed feedback resonator structure with a direction of radially alternating optical refractive index. The optical resonator comprises also a second set of nested optical regions, which form a distributed feedback resonator structure with a direction of radially alternating optical refractive index. Each optical region of the second set is interrupted by a first gap region, wherein the first gap regions are arranged to substantially overlap in the direction of alternating optical refractive index. The first set is arranged nested within the second set. The Optical structure further comprises a first optical waveguide optically coupled to the optical resonator via a first waveguide portion reaching into the first gap regions.

The functionality can essentially be explained by understanding the optical structure of FIG. 1a as a further development of the regular optical resonator represented by the first set, enhanced by the second set which collects the light that would leave the first set at other positions than where the first waveguide abuts, and reflects this light back into the first set. The first waveguide essentially improves its coupling by the second set, while also increasing the quality value of the resonance.

The first gap regions have an optical refractive index that is lower than the higher of the refractive indices of the optical regions of the second set. Preferably the refractive index is as low or lower than the lowest of the refractive indices of the second set.

The functionality of a distributed feedback resonator is for instance provided by each optical region having either a lower or a higher optical refractive index than its neighboring optical regions. This is also referred to as a Bragg structure. Such structure can, however also comprise optical regions that have an intermediate optical refractive index, hence the optical refractive index profile in radial direction goes up and down over steps. In any case, the optical refractive indices of the optical regions alternate in a radial direction. The alternating minima and maxima of the optical refractive index provide for an internal reflection distributed over the radial extension of the resonator.

The first set can have a circular shape, or any other closed shape. In a preferred embodiment the first set is a planar resonator and the second set is preferably arranged coplanar to the first set. The waveguide can be preferably a ridge waveguide, or another planar waveguide that is coupled in plane with the planar optical resonator.

In a preferred embodiment the first waveguide portion reaches through the first gap regions towards the first set. The distance between the end of the first waveguide portion and the first set determines on one hand the quality of the coupling of the first waveguide portion to the first set, but on the other hand is dependent on the wavelength, the refractive indices involved, and the spatial characteristics of the resonance mode to be coupled to the first waveguide portion. A preferred design rule is to select the distance between the end of the first waveguide portion and the first set such that the effect of better coupling of the first waveguide portion to the first set with reduced distance overlaps with a phase-matching of the waveguide and the first set.

Also the gap width of the first gap region has two effects. The larger the gap, the smaller the angle at which the second set can effectuate light reflection. The smaller the gap width the higher the interference between the light contained in the second set and the light guided in the waveguide. The first gap region has a gap width that is preferably selected such that the effect of overlap of the optical field around the nested optical regions with the optical field around the first waveguide portion is substantially equal to the effect of reduced reflection of the second set due to the gap region. Due to the fact that the further away the optical regions are from the center of the resonator, the smaller is their contribution to the backreflection of the light guided in the resonator, the gap regions can be selected larger with growing radial distance, thereby reducing the above described interference effect more than reducing the reflection. A possible design rule can be to select the gap widths linearly dependent on the radial distance, i.e. the distance from the center of the first set or second set.

In a preferred embodiment an optimum trade-off between these two non desirable effects can be achieved. The optimum solution can be a gap width that varies in the radial direction.

In a preferred embodiment the first optical waveguide has a lobe-like end, at least part of which forms the first waveguide portion. This shape has a lens-like effect, concentrating or focusing the light into the first waveguide portion.

In a preferred embodiment each optical waveguide of the second set is interrupted by a second gap region, wherein the second gap regions are arranged to substantially overlap perpendicularly to the direction of alternating optical refractive index, and wherein within the second gap region regions a second portion is arranged pertaining to a second planar optical waveguide. This design makes the optical structure a two port device. The relative angular position of the two regions can be selected to fit a desired transfer function of the optical resonator structure. This position is dependent on the standing wave pattern of the lightwave contained in the first set. The position can be selected to couple a maximum of a specific resonance mode into or out of the corresponding first or second waveguide.

In a preferred embodiment the second planar optical waveguide and the first waveguide converge into a common waveguide. This design can be used as a bidirectional one port device. The optical lengths of the two waveguides can be selected to interfere in a predetermined manner, preferably in a constructive manner. This design can also be extended to more than two waveguides.

In a preferred embodiment the optical regions have one of an circular, oval, rectangular, and polygonal shape. A very often used form of nested regions in a nested arrangement is a circular Bragg reflector. However, for specific applications there can also be used other shapes, as listed above.

According to another aspect of the invention there is provided an optical structure comprising an optical resonator that comprises a first set of nested coplanar closed regions, which form a distributed feedback resonator structure with a direction of radially alternating optical refractive index. A first optical waveguide comprises several waveguide arms, each of which being optically coupled to the optical resonator and being arranged at a different position of the first set, wherein the waveguide arms converge into the optical waveguide. This arrangement is advantageous since it uses a number of waveguide arms in conjunction with an optical resonator that is undisturbed by deviations such as gap regions. The distributed feedback resonator structure can e.g. be realized by each optical region having either a lower or a higher optical refractive index than its neighboring optical regions.

BRIEF DESCRIPTION OF THE SEVERAL VIEWS OF THE DRAWINGS

The invention and its embodiments will be more fully appreciated by reference to the following detailed description of presently preferred but nonetheless illustrative embodiments in accordance with the present invention when taken in conjunction with the accompanying drawings.

The figures are illustrating.

DETAILED DESCRIPTION OF THE INVENTION

Figure 1A:
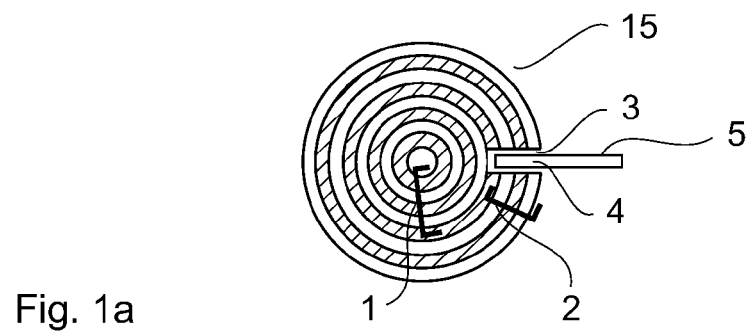
FIG. 1a, an optical structure with a first set of optical regions, a second set of optical regions and a first waveguide, FIG. 1b, a functionality illustration of the optical structure of FIG. 1, FIG. 2, an optical structure with a first set of optical regions, a second set of optical regions, a first waveguide, and a second waveguide, FIG. 3, an optical structure with a first set of optical regions and a first waveguide comprising waveguide arms, FIG. 4, an optical structure with a first set of optical regions and a first waveguide with a lobe-like shaped end, FIG. 5, an optical structure with a first set of optical regions, a second set of optical regions and a first waveguide with a lobe-like shaped end.

In FIG. 1a an optical resonator 15, in the concrete embodiment a circular grating resonator 15, is depicted. The circular grating resonator 15 comprises a first set 1 of optical regions that have a closed form and are arranged in a nested way, i.e. there is an outermost optical region which surrounds all other optical regions of the first set 1, and there is an innermost optical region surrounded by all other optical regions of the first set 1. The optical regions all have a substantially planar form and are arranged in the same plane, i.e. are coplanar.

In the concrete embodiment the nested, closed optical regions are present in form of concentric rings. The optical regions of the first set 1 have an alternating refractive index, i.e. every ring has a refractive index that is either lower or higher than the refractive index of the neighboring rings. Hence along a radial direction of the concentric optical region rings the refractive index alternates between increasing and decreasing. In the drawing the optical region rings with a higher refractive index are hatched, in comparison to those optical region rings with a lower refractive index. All individual rings can have a different refractive index as long as along a radial line the refractive index alternatingly goes up and down. The direction of alternating refractive index exists also with other shapes of optical regions, and is hereinafter referred to as gradient line. The embodiment can also comprise nested optical regions whose optical refractive index is between the optical refractive index of their neighboring optical regions. The functionality of the resonator depends on the fact that over the range of its radial extension there is an alternation between higher and lower optical refractive index. Such functionality is referred to as a distributed radial feedback.

The circular grating resonator 15 furthermore comprises a set of concentric ring segments that are referred to as second set 2. The optical regions of the second set 2 are also planar and coplanar to the first set 1. Also the optical regions of the second set 2 are nested in the same manner as are the optical regions of the first set 1. Furthermore, also the optical regions of the second set 2 have an alternating refractive index, i.e. every optical region has a refractive index that is either lower or higher than the refractive index of the neighboring optical regions. Hence along a radial direction of the concentric region rings the refractive index alternatingly increases and decreases. All individual optical regions can have different refractive index as long as it is ascertained that along a radial line the refractive index goes up and down. The direction of alternating refractive index exists also with other forms of nested optical regions. Other rings may have a refractive index that lies between that of the neighboring rings.

The optical regions of the second set 2 as they are here exemplarily designed as ring regions, are arranged concentrically to the first set 1. This means that the innermost ring of the second set 2 encloses the outermost ring of the first set 1.

The second set 2 is different from the first set 1 in that all optical region rings are interrupted by a first gap region 3 of lower refractive index, thereby making the optical region rings into optical region ring segments. The first gap region 3 corresponds to a slit that has been cut out of the respective ring to form the ring segment, wherein this slit is filled with an optical material that has a lower refractive index than the refractive index of the optical regions. The first gap regions 3 are arranged in an overlapping manner. In FIG. 1a, the first gap regions 3 are exemplarily all designed to have an equal gap width which is arranged to exactly overlap.

A first optical waveguide 5, which here is exemplarily a planar waveguide, comprises a first waveguide portion 4 that reaches into the first gap regions 3. Thereby the first planar optical waveguide 5 is optically coupled to the optical resonator 15. The first planar optical waveguide 5 is arranged coplanar with the optical resonator 15 and its first waveguide portion 4 reaches through the first gap regions 3 towards the first set 1. The refractive index of the first optical waveguide 5 is higher than the refractive index of the first gap regions 3. Preferably the refractive index of the first optical waveguide 5 is substantially the same refractive index as the higher refractive index of the optical regions of the second set 2.

The first gap regions 3 have a width that is larger than the width of the first waveguide portion 4. The gap width has two countersteering effects: The larger the gap width is, the smaller is the effective angle of the second set 2, and hence the smaller is the additional reflection created by the optical regions of the second set. On the other hand, the smaller the gap width is, the stronger is the coupling between the light contained in the optical regions of the second set and the light guided in the first waveguide portion 4. This coupling is undesired, since it disturbs the lightwave guided in the first waveguide portion 4. The preferred design rule is to select the gap width substantially where the two effects cancel each other.

The circular grating resonator 15 is optically coupled to the first planar optical waveguide 5 which serves as a light channel. The arrangement of FIG. 1a is a single-port device e.g. for an application as a laser device.

Figure 1B:
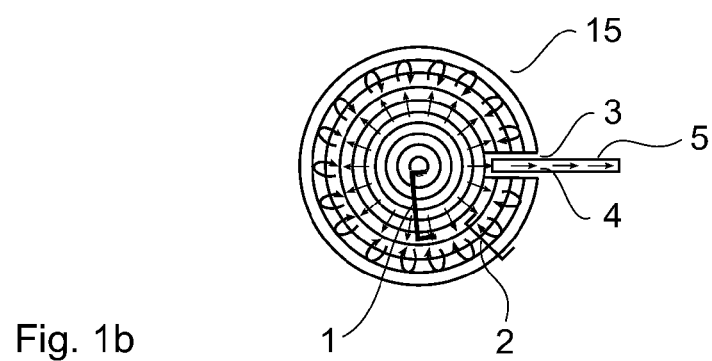

In FIG. 1b the functionality of the device of FIG. 1a is visualized. The first set 1 seen alone works as an optical resonator with its resonance being uninhibited by any structural deviations from a regular circular optical resonator. In operation this optical resonator is filled with light. The first planar optical waveguide 5 is coupled to the optical resonator represented by the first set 1 and thereby receives light that is then guided away through the first planar optical waveguide 5.

A "waveguide" is herein understood as a light channel that provides vertical and lateral confinement of the light traveling therein, as in, e.g. strip and ridge waveguides.

Without the second set 2, the optical resonator 15 encounters a problem of relatively inefficient optical coupling between a grating resonator mode, i.e. a light mode that is localized in the optical resonator 15 and a waveguide mode, i.e. a light mode that travels towards or away from the optical resonator 15 in the first planar optical waveguide 5. This coupling can be understood quantitatively as follows. If a grating resonator mode is excited, i.e. the optical resonator 15 is filled with light, then this light will eventually leak out of the optical resonator 15. For a device with negligible optical absorption and scattering losses there are two ways for the light to leave the optical resonator 15. It either exits through the edges of the optical resonator 15 uncollected or it is collected by the first planar optical waveguide 5. The fraction of light power collected by the first planar optical waveguide 5 related to the total light power emitted is referred to as coupling C. A coupling C with a value of 100% means that all the light from the resonator mode is emitted into the first planar optical waveguide 5, which is the optimum.

The coupling between the grating resonator mode and the waveguide mode is directionally symmetric. This means that if there is a predetermined outcoupling of resonator light from the optical resonator 15 into the first planar optical waveguide 5 then incoming light from the first planar optical waveguide 5 will couple to the same extent into the grating resonator mode.

The grating resonator mode is symbolized in FIG. 1a by bold rings in the center of the first set 1. Light propagates in the resonator structure of the first set 1 and leaves the first set 1 on its edges. Only a fraction of that light is collected by the first planar optical waveguide 5. The rest of the light is not collected by the first planar optical waveguide 5. Letting the first planar optical waveguide 5 simply end outside the resonator represented by the first set 1 yields a lower value for the coupling C. With the second set 2, however, a higher value for the coupling C between the optical resonator 15 and the first planar optical waveguide 5 can be achieved. The second set 2 extends the grating resonator of the first set 1 by additional region rings beyond the outermost ring of the first set 1. This has the effect that the leakage of light out of the grating resonator mode is funneled into the first planar optical waveguide 5. Light in the grating resonator mode which is not directed into the waveguide mode, illustrated by arrows pointing outwards from the first set 1 towards the second set 2, encounters additional grating rings and is thereby reflected back into the resonator mode. This is illustrated in FIG. 1*b* by the curved arrows pointing towards the center of the optical resonator 15.

The circular grating resonator 15 can have a footprint of a few micrometers, as small as two-dimensional photonic crystal resonators. Unlike classical two-dimensional photonic crystal resonators, the circular grating resonator 15 can offer full two-dimensional light confinement also for relatively low refractive index contrasts between the optical materials employed. This means that circular grating resonator 15 can operate with lower refractive index contrasts than photonic crystal resonators. The optical structure can be used for different applications. For the functionalities of light sources, including lasers, electrooptical modulators, and all-optical switches at least one of the materials that are used to physically implement the circular grating resonator 15 has an optical non-linearity which depends on the specific functionality, e.g. optical gain for lasers, or an electrooptical coefficient for electrooptical modulators. Moreover, for the functionality of electrooptical modulators the optical structure furthermore may comprise a technical means to apply an electric field in the region of the circular grating resonator 15, such as electrodes arranged above and beneath the circular grating resonator 15. Finally, for the functionality "lasers" the gain material in the circular grating resonator 15 can be pumped, e.g. by electrical or optical means.

Figure 2:
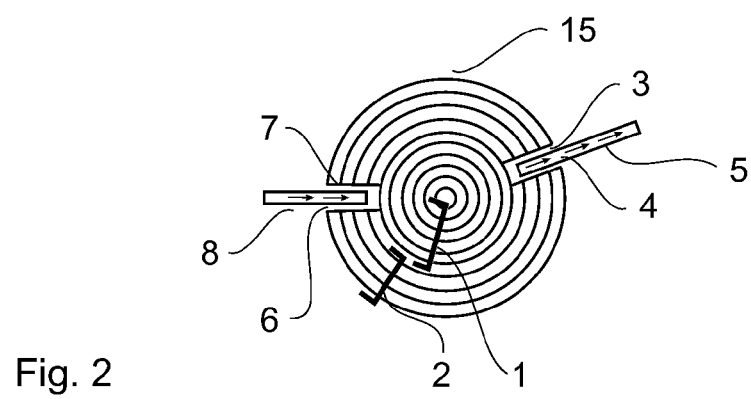

Two-port devices are suitable e.g. for filters and electrooptical modulators. In FIG. 2 an optical structure usable as a two port device is depicted. The optical structure deviates from the optical structure depicted in FIG. 1 in that it comprises a second planar optical waveguide 8 that protrudes with a second waveguide portion 7 into second gap regions 6 that are located in the optical regions of the second set 2. The second gap regions 6 are arranged in an overlapping manner. In FIG. 2, the second gap regions 6 are exemplarily all designed to have an equal gap width which is here arranged to exactly overlap. The second planar optical waveguide 8 is hence optically coupled to the optical resonator 15. The second planar optical waveguide 8 is arranged coplanar with the optical resonator 15 and its second waveguide portion 7 reaches through the second gap regions 6 towards the first set 1. The second gap regions 6 have a larger gap width than the width of the second waveguide portion 7.

Light arriving from an inward traveling mode of the second planar optical waveguide 8 couples to a grating resonator mode of the circular grating resonator 15. The same grating resonator mode in turn couples to an outward traveling mode of the first planar optical waveguide 5. If the light frequency is in resonance with the resonator mode and if the value of coupling C is 100% for both regions 5, 8 then 100% light transmission from the second planar optical waveguide 8 to the first planar optical waveguide 5 can be achieved, with all light passing through the grating resonator mode. Such a device could, e.g. serve as an electrooptical modulator or as a spectral filter.

The embodiment of FIG. 2 can be modified by adding more waveguides that are coupled to the first set. Thereby multi-port devices can be constructed.

Figure 3:
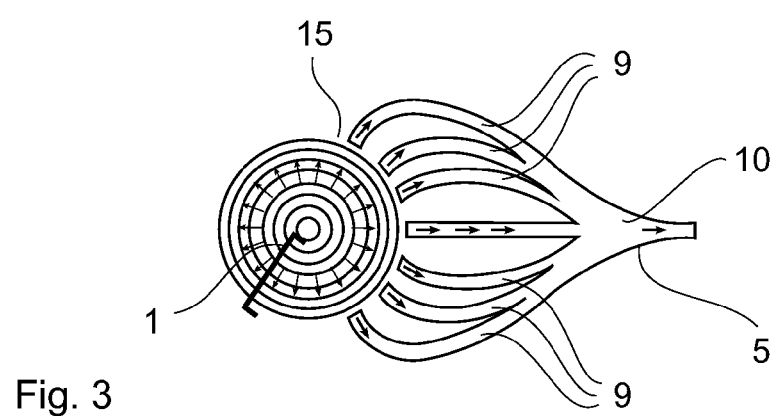

Another coupling scheme is illustrated in FIG. 3. The optical structure comprises again an optical resonator 15. This optical resonator 15 comprises a first set 1 of optical regions, as described in conjunction with FIG. 1*a*. Again, in-plane light coupling to a first planar optical waveguide 5 is provided. The first planar optical waveguide 5 comprises several waveguide arms 9 each of which ends at a different location along the perimeter of the circular grating resonator 15. The first planar optical waveguide 5 furthermore comprises a waveguide joint 10 at which the different waveguide arms 9 come together. The waveguide joint 10 has a tapered form.

The first planar optical waveguide 5 hence ends outside the circular grating resonator 15 and the waveguide shape at the circular grating resonator 15 is designed to catch more light than is possible with the waveguide end being non-modified. The first planar optical waveguide 5 is split up into the several waveguide arms 9 such that light is collected from many points on the perimeter of the circular grating resonator 15 and recombined into the first planar optical waveguide 5 by means of the waveguide joint 10. The optical length of the individual waveguide arms 9 is selected such that the light guided therein interferes constructively at the point of recombination in the waveguide joint 10.

Figure 4:
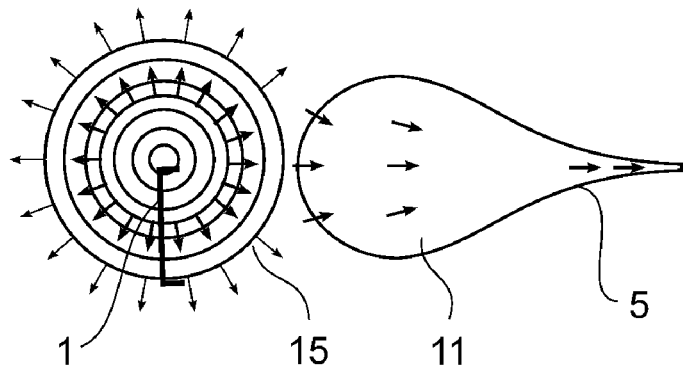

FIG. 4 shows an optical structure with a first planar optical waveguide 5 that has a lobe-shaped waveguide end 11, also referred to as lens-like shaped waveguide end. Again, the optical structure comprises a first set 1 of optical regions, as described in conjunction with FIG. 1*a*. In this design, light exiting the circular grating resonator 15 at different points and directions is refracted into the first planar optical waveguide 5 by the lobe-shaped waveguide end 11. The connection between the lobe-shaped waveguide end 11 and the first planar optical waveguide 5 is here tapered in order to laterally compress the guided light mode.

Figure 5:
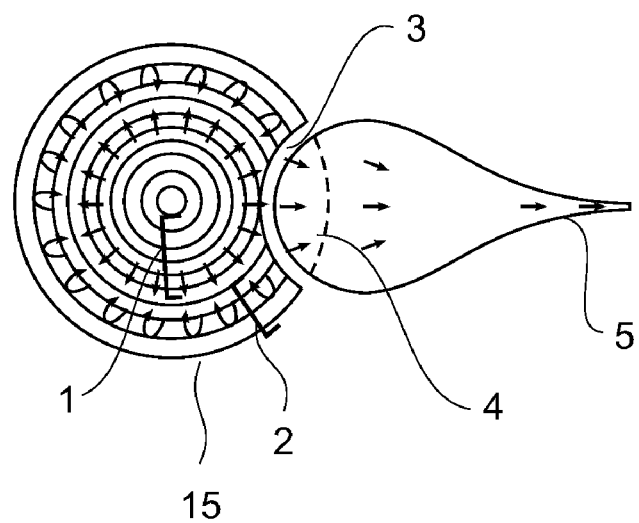

Not necessarily all light from the circular grating resonator 15 is collected by the modified first planar optical waveguide 5 as illustrated in FIG. 4. In FIG. 5 a combination of the principle applied in FIG. 4 and the principle applied in FIG. 1 is used in the depicted optical resonator structure. The optical structure comprises a circular grating resonator 15 that has the same structure as the circular grating resonator 15 of FIG. 1*a*. It hence comprises a first set 1 and a second set 2 of nested coplanar optical regions. The first planar optical waveguide 5 has a lobe-shaped waveguide end 11 that protrudes into the gap region formed by the overlapping first gap regions 3. Hence, the lobe-shaped waveguide end 11 collects on one hand more light due to its lobe-like shape which effectuates a focusing of the light from the grating resonator mode into the waveguide mode. On the other hand, the lobe-shaped waveguide end 11 by virtue of its position within the first gap regions 3 benefits from the reflection of the light exiting from the first set 1 and back-reflected by the second set 2.

Several regions according to any of the designs specified in FIGS. 1*a*, 3, 4, and 5 can be coupled to the same circular grating resonator 15. Hence, a possible variant would be to change the design in the embodiment of FIG. 3 by having the waveguide arms 9 protrude into gap regions 3 arranged in a second set 2 of regions within which the first set 1 is nested. The number and directions of regions can be selected dependent on the application.

Various photonic functionalities can be implemented on the basis of an optical resonator. Prominent examples thereof are spectral filters, light sources such as lasers, electro-optic modulators, and all-optical switches. The invention is applicable to all these and other optical resonator-based functionalities, independent of their specific application in data communication, computing, environmental sensing, chemistry, biology or any other area.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention defined in the appended claims.

That which is claimed is:

1. Optical structure comprising:
   an optical resonator, the optical resonator comprising a first set of nested closed optical regions forming a distributed feedback resonator structure with a direction of radially alternating optical refractive index, and a second set of nested optical regions forming a distributed feedback resonator structure with a direction of radially alternating optical refractive index, each optical region of said second set is interrupted by a first gap region with a lower refractive index, said first gap region substantially overlap in the direction of radially alternating optical refractive index, said first set being nested within the second set;
   a first optical waveguide optically coupled to the optical resonator via a first waveguide portion reaching into the first gap region and being arranged coplanar to said optical resonator.

2. The optical structure according to claim 1, wherein the first waveguide portion reaches through the first gap region towards the first set.

3. The optical structure according to claim 1, wherein said first gap region has a gap width that is selected such that the effect of overlap of the optical field around the nested optical regions with the optical field around the first waveguide portion is substantially equal to the effect of reduced reflection of the second set due to the gap region.

4. The optical structure according to claim 1, wherein said first optical waveguide has a lobe-like end, at least part of which forms the first waveguide portion.

5. The optical structure according to claim 1, wherein each optical region of said second set is interrupted by a second gap region with a lower refractive index, wherein said second gap region substantially overlap in the direction of radially alternating optical refractive index, and wherein within said second gap region a second waveguide portion pertaining to a second optical waveguide is arranged.

6. The optical structure according to claim 1, wherein the second waveguide portion is arranged coplanar to said optical resonator.

7. The optical structure according to claim 1, wherein said second optical waveguide and said first optical waveguide converge into a common waveguide.

8. An optical structure comprising:
   an optical resonator that comprises a first set of nested closed optical regions, forming a distributed feedback resonator structure with a direction of radially alternating optical refractive index,
   a first optical waveguide comprising several waveguide arms, each of which being optically coupled to the optical resonator at a different position of the first set, wherein said waveguide arms converge into said optical waveguide.

9. The optical structure according to claim 8, wherein said first optical waveguide is arranged coplanar to said optical resonator.

10. The optical structure according to claim 8, further comprising a second set of nested optical regions, forming a distributed feedback resonator structure with a direction of radially alternating optical refractive index, each optical region of said second set being interrupted by at least one first gap region, wherein said first gap region substantially overlap in the direction of radially alternating optical refractive index, wherein said first set is arranged nested within the second set, wherein at least one of said waveguide arms reaches into at least one of the first gap region.

11. The optical structure according to claim 8, wherein at least one of said waveguide arms has a lobe-like end.

12. The optical structure according to claim 8, wherein each optical region of said second set is interrupted by a second gap region, wherein said second gap region substantially overlap in the direction of radially alternating optical refractive index, and wherein within said second gap region a second waveguide portion pertaining to a second optical waveguide is arranged.

13. The optical structure according to claim 8, wherein said second waveguide portion is coplanar to said optical resonator.

* * * * *